(12) United States Patent
Kanemoto (10) Patent No.: US 7,326,603 B2
(45) Date of Patent: Feb. 5, 2008

(54) SEMICONDUCTOR DEVICE, METHOD OF MANUFACTURING SEMICONDUCTOR SUBSTRATE, AND METHOD OF MANUFACTURING SEMICONDUCTOR DEVICE

(75) Inventor: Kei Kanemoto, Nagano (JP)

(73) Assignee: Seiko Epson Corporation (JP)

( * ) Notice: Subject to any disclaimer, the term of this patent is extended or adjusted under 35 U.S.C. 154(b) by 76 days.

(21) Appl. No.: 11/211,018

(22) Filed: Aug. 24, 2005

(65) Prior Publication Data

US 2006/0071279 A1 Apr. 6, 2006

(30) Foreign Application Priority Data

Oct. 1, 2004 (JP) .............................. 2004-289641

(51) Int. Cl.
*H01L 21/84* (2006.01)

(52) U.S. Cl. ................ 438/152; 438/422; 257/E21.628

(58) Field of Classification Search ................ 438/152, 438/165, 275, 405, 411, 412, 422, 970, 976; 257/E21.628

See application file for complete search history.

(56) References Cited

U.S. PATENT DOCUMENTS 6,713,356 B1 * 3/2004 Skotnicki et al. ........... 438/285

2003/0151112 A1 * 8/2003 Yamada et al. ............. 257/510
2004/0235262 A1 11/2004 Lee

FOREIGN PATENT DOCUMENTS

| JP | 2003-203967 | 7/2003 |
|---|---|---|
| JP | 2003-324200 | 11/2003 |

OTHER PUBLICATIONS

T. Sakai et al., Separation by Bonding Si Islands (SBSI) for LSI Applications, May 2004, pp. 230-231.

* cited by examiner

*Primary Examiner*—Chandra Chaudhari
(74) *Attorney, Agent, or Firm*—Harness, Dickey & Pierce, P.L.C.

(57) ABSTRACT

A semiconductor device includes a semiconductor substrate that has an oxide film selectively formed on a part thereof; a semiconductor layer that is formed on the oxide film by epitaxial growth; a first gate electrode that is formed on the semiconductor layer; first source/drain layers that are formed on the semiconductor layer so as to be disposed at both sides of the first gate electrode, respectively; a second gate electrode that is formed on the semiconductor substrate; and second source/drain layers that are formed on the semiconductor substrate so as to be disposed at both sides of the second gate electrode, respectively.

10 Claims, 6 Drawing Sheets

SEMICONDUCTOR DEVICE, METHOD OF MANUFACTURING SEMICONDUCTOR SUBSTRATE, AND METHOD OF MANUFACTURING SEMICONDUCTOR DEVICE

RELATED APPLICATIONS

This application claims priority to Japanese Patent Application No. 2004-289641 filed Oct. 1, 2004 which is hereby expressly incorporated by reference herein in its entirety.

BACKGROUND OF THE INVENTION

1. Technical Field

The present invention relates to a semiconductor substrate, to a semiconductor device, to a method of manufacturing a semiconductor substrate, and to a method of manufacturing a semiconductor device. In particular, the invention is preferably applied to a method in which an SOI structure and a bulk structure exist together on the same substrate.

2. Related Art

Field effect transistors formed on an SOI substrate have been of main interest in terms of convenience of element separation, latch-up free property, small source/drain junction capacitance, and so on. In particular, since a complete depletion-type SOI transistor has features, such as low power consumption, high speed operation, and low-voltage driving, research for operating an SOI transistor in the total depletion mode has been actively carried out. Here, as the SOI substrate, a SIMOX (separation by implanted oxygen) substrate or a bonded substrate is used, for example.

On the other hand, it is difficult to form the field effect transistor, which has a large power for current driving and requires a high withstanding voltage, on the SOI substrate in which the thickness of a silicon layer is limited. Therefore, it is required that the field effect transistor be formed on the bulk substrate.

For example, Japanese Unexamined Patent Application Publication No. 2003-203967 discloses a method in which a silicon layer and a BOX layer disposed on a part of an SOI substrate are selectively removed and an epitaxial silicon layer is formed on the part thereof to thereby form a non-SOI region on the SOI substrate, so that SOI transistors and transistors capable of withstanding high voltages can exist together on the same substrate.

However, in order to manufacture the SIMOX substrate, high-concentration oxygen ions are needed to be implanted into a silicon wafer. In addition, in order to manufacture the bonded substrate, it is required to polish the surface of the silicon wafer after two wafers are bonded to each other. For this reason, in the method in which the non-SOI region is provided on the SOI substrate, manufacturing costs increase as compared to a method in which the field effect transistors are formed in a bulk semiconductor.

SUMMARY

An advantage of the invention is that it provides a semiconductor device, a method of manufacturing a semiconductor substrate, and a method of manufacturing a semiconductor device having both an SOI structure and a bulk structure thereon without using an SOI substrate.

According to an aspect of the invention, a semiconductor device includes: a semiconductor substrate that has an oxide film selectively formed on a part thereof; a semiconductor layer that is formed on the oxide film by epitaxial growth; a first gate electrode that is formed on the semiconductor layer; first source/drain layers that are formed on the semiconductor layer so as to be disposed at both sides of the first gate electrode, respectively; a second gate electrode that is formed on the semiconductor substrate; and second source/drain layers that are formed on the semiconductor substrate so as to be disposed at both sides of the second gate electrode.

According to the above-mentioned structure, the SOI structure can be formed on a part of the semiconductor substrate, so that the SOI structure and the bulk structure can be formed on the same semiconductor substrate. As a result, it is possible to form SOI transistors and transistors capable of withstanding high voltages on the same semiconductor substrate, which makes SOC (System On chip) realized while suppressing a cost increase.

Further, according to another aspect of the invention, a method of manufacturing a semiconductor substrate includes: selectively forming a first semiconductor layer on a part of a surface of the semiconductor substrate; forming a second semiconductor layer on the first semiconductor layer, the second semiconductor layer having a selectivity smaller than that of the first semiconductor layer at the time of etching; forming an insulating film on the semiconductor substrate to cover the second semiconductor layer; forming an opening in the insulating film, the opening exposing a part of an edge of the first semiconductor layer; forming, below the second semiconductor layer, a cavity where the first semiconductor layer is removed, by selectively etching the first semiconductor layer through the opening; and forming a buried oxide film in the cavity by performing a thermal oxidation treatment on the second semiconductor layer and the semiconductor substrate through the opening.

According to the above-mentioned method, the first semiconductor layer can be removed with the second semiconductor layer remaining, and thus the cavity can be formed below the second semiconductor layer. Further, by covering the second semiconductor layer with the insulating film, the second semiconductor layer can be supported on the semiconductor substrate by the insulating film even when the cavity is formed below the second semiconductor layer. Furthermore, by providing the opening, which exposes the part of the edge of the first semiconductor layer, in the insulating film, it becomes possible to bring the first semiconductor layer into contact with an etching gas or etching solution, and accordingly, it becomes possible to remove the first semiconductor layer with the second semiconductor layer remaining, although the second semiconductor layer is formed on the first semiconductor layer. In addition, by performing a thermal oxidation treatment on the second semiconductor layer, it is possible to form an oxide film in the cavity located below the second semiconductor layer. Thereby, it is possible to dispose the second semiconductor layer on the oxide film while reducing the possibility of the second semiconductor layer being damaged, and thus the insulation between the second semiconductor layer and the semiconductor substrate can be made without damaging the quality of the second semiconductor layer. As such, the SOI transistors can be formed on the second semiconductor layer without using the SOI substrate, and as a result, it is possible to improve the quality of the SOI transistor while suppressing a cost increase.

In the above-mentioned aspect of the invention, it is preferable that the method of manufacturing a semiconductor substrate further includes forming an element separation film on the semiconductor substrate before selectively forming the first semiconductor layer on the part of the surface of the semiconductor substrate. Also, it is preferable that the first semiconductor layer be selectively formed on a part of the semiconductor substrate separated by the element separation film.

Thereby, it is possible to form the SOI structure on the part of the semiconductor substrate separated by the element separation film and to form the bulk structure on another part of the semiconductor substrate separated by the element separation film. As such, the SOI structure and the bulk structure can be formed on the same semiconductor substrate without using the SOI substrate. As a result, it is possible to form SOI transistors and transistors capable of withstanding high voltages on the same semiconductor substrate while suppressing a cost increase.

Further, in the above-mentioned aspect of the invention, it is preferable that the opening expose the part of the edge of the first semiconductor layer and an element separation region. Also, it is preferable that, in the forming the buried oxide film in the cavity, the element separation film be formed on the semiconductor substrate, and that the buried oxide film be formed in the cavity.

Thereby, it is possible to form the SOI structure on the part of the semiconductor substrate and to form the bulk structure on another part of the semiconductor substrate separated by the element separation film, while realizing the element separation of the semiconductor substrate. As such, the SOI structure and the bulk structure can be formed on the same semiconductor substrate without using the SOI substrate, and accordingly, it is not necessary to perform an additional element separation process. As a result, it is possible to form SOI transistors and transistors capable of withstanding high voltages on the same semiconductor substrate while suppressing a cost increase.

Further, according to still another aspect of the invention, a method of manufacturing a semiconductor device includes: selectively forming a first semiconductor layer on a part of a surface of the semiconductor substrate; forming a second semiconductor layer on the first semiconductor layer, the second semiconductor layer having a selectivity smaller than that of the first semiconductor layer at the time of etching; forming an insulating film on the semiconductor substrate to cover the second semiconductor layer; forming an opening in the insulating film, the opening exposing a part of an edge of the first semiconductor layer; forming, below the second semiconductor layer, a cavity where the first semiconductor layer is removed, by selectively etching the first semiconductor layer through the opening; forming a buried oxide film in the cavity by performing a thermal oxidation treatment on the second semiconductor layer and the semiconductor substrate through the opening; forming a gate electrode on the second semiconductor layer with the gate insulating film interposed therebetween; and forming source/drain layers on the second semiconductor layer so as to be disposed at both sides of the gate electrode.

Thereby, it is possible to dispose the second semiconductor layer on the oxide film while reducing the possibility of the second semiconductor layer being damaged, and thus the insulation between the second semiconductor layer and the semiconductor substrate can be made without damaging the quality of the second semiconductor layer. As such, the SOI transistors can be formed on the second semiconductor layer without using the SOI substrate, and as a result, it is possible to increase the quality of the SOI transistor while suppressing a cost increase.

Further, in the above-mentioned aspect of the invention, it is preferable that the method of manufacturing a semiconductor device further include forming an element separation film on the semiconductor substrate before selectively forming the first semiconductor layer on the part of the surface of the semiconductor substrate be further included. Also, it is preferable that the first semiconductor layer be selectively formed on a part of the semiconductor substrate separated by the element separation film.

Thereby, it is possible to form the SOI structure on the part of the semiconductor substrate separated by the element separation film and to form the bulk structure on another part of the semiconductor substrate separated by the element separation film. As such, the SOI transistors and the transistors capable of withstanding high voltages can be formed on the same semiconductor substrate without using the SOI substrate. As a result, it is possible to realize SOC while suppressing a cost increase.

Furthermore, in the above-mentioned aspect of the invention, it is preferable that the opening expose the part of the edge of the first semiconductor layer and an element separation region. Also, it is preferable that, in the forming the buried oxide film in the cavity, the element separation film be formed on the semiconductor substrate, and that the buried oxide film be formed in the cavity.

Thereby, it is possible to form the SOI structure on a part of the semiconductor substrate and to form the bulk structure on another part of the semiconductor substrate separated by the element separation film, while realizing the element separation of the semiconductor substrate. As such, the SOI transistors and the transistors capable of withstanding high voltages can be formed on the same semiconductor substrate without using the SOI substrate, and accordingly, it is not necessary to perform an additional element separation process. As a result, it is possible to realize SOC while suppressing a cost increase.

BRIEF DESCRIPTION OF THE DRAWINGS

The invention will be described with reference to the accompanying drawings, wherein like numbers reference like elements, and wherein.

DETAILED DESCRIPTION

Hereinafter, a semiconductor device and a method of manufacturing the same according to embodiments of the invention will be described with reference to the accompanying drawings.

FIGS. 1A and 1B and 3A to 3C are cross-sectional views illustrating a method of manufacturing a semiconductor device according to a first embodiment of the invention. FIG. 2A is a plan view illustrating the method of manufacturing the semiconductor device according to the first embodiment of the invention, FIG. 2B is a cross-sectional view taken along the line IIB-IIB of FIG. 2A, and FIG. 2C is a cross-sectional view taken along the line IIC-IIC of FIG. 2A.

Figure 1A:
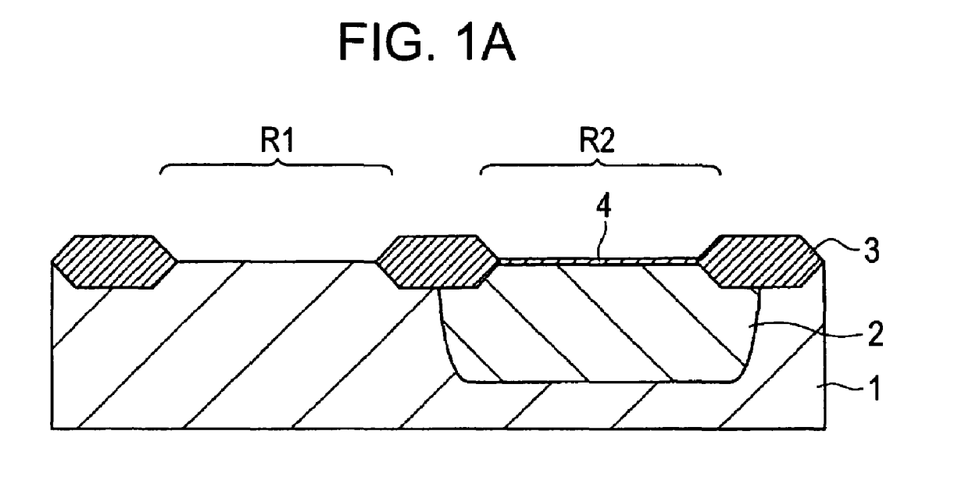
FIG. 1A is a cross-sectional view illustrating a method of manufacturing a semiconductor device according to a first embodiment of the invention.
Figure 2A:
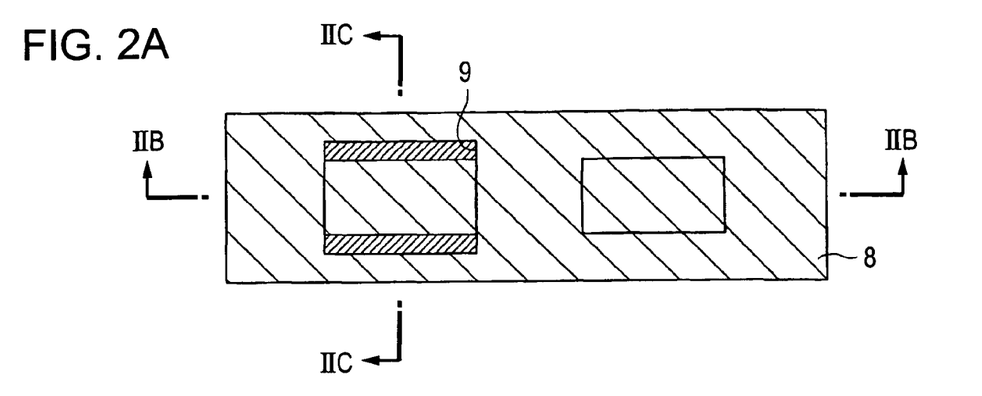
FIG. 2A is a plan view illustrating the method of manufacturing the semiconductor device according to the first embodiment of the invention.

Referring to FIG. 1A, a semiconductor substrate 1 has an SOI formation region R1 and a bulk region R2. Impurities are ion-implanted into the bulk region R2 using photolithography and etching techniques, and then the semiconductor substrate 1 is heat-treated to form a well 2 in the bulk region R2. The semiconductor substrate 1 can be made of, for example, Si, Ge, SiGe, SiC, SiSn, PbS, GaAs, InP, GaP, GaN, ZnSe, or the like. Then, an element separation film 3 is formed on the semiconductor substrate 1 using a LOCOS (local oxidation of silicon) method, thereby separating the SOI formation region R1 from the bulk region R2. Then, by patterning a pad oxide film 4 using the photolithography and etching techniques, the pad oxide film 4 in the SOI formation region R1 is removed while the pad oxide film 4 in the bulk region R2 remains, thus exposing the semiconductor substrate 1 in the SOI formation region R1.

Figure 1B:
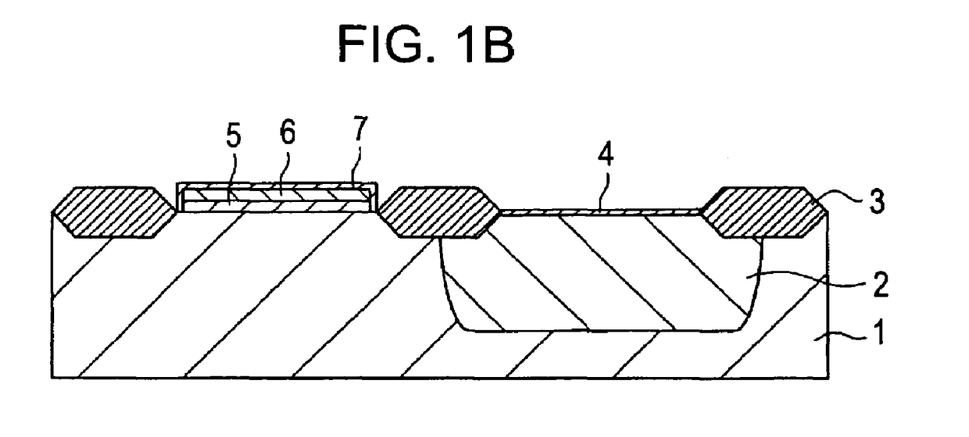
FIG. 1B is a cross-sectional view illustrating the method of manufacturing the semiconductor device according to the first embodiment of the invention.

Next, as shown in FIG. 1B, a first semiconductor layer 5 and a second semiconductor layer 6 are sequentially formed in the SOI formation region R1 of the semiconductor substrate 1 by performing epitaxial growth with the pad oxide film 4 as a mask. The first semiconductor layer 5 can be made of a material having a selectivity larger than those of the semiconductor substrate 1 and the second semiconductor layer 6 at the time of etching, and the first semiconductor layer 5 and the second semiconductor layer 6 can be made of a combination selected among Si, Ge, SiGe, SiC, SiSn, PbS, GaAs, InP, GaP, GaN, ZnSe, and the like. In particular, when Si is used for the semiconductor substrate 1, it is preferable that SiGe be used for the first semiconductor layer 5 and Si be used for the second semiconductor layer 6. Thus, the lattice matching between the first semiconductor layer 5 and the second semiconductor layer 6 can be realized, while the selectivity between the first semiconductor layer 5 and the second semiconductor layer 6 can be secured at the time of etching. Further, a sacrificing oxide film 7 is formed on a surface of the second semiconductor layer 6 by performing a thermal oxidation treatment on the second semiconductor layer 6. The thicknesses of the first and second semiconductor layers 5 and 6 may be, for example, approximately 10 to 200 nm, respectively, and the thickness of the sacrificing oxide film 7 may be, for example, approximately 10 nm.

Figure 2B:
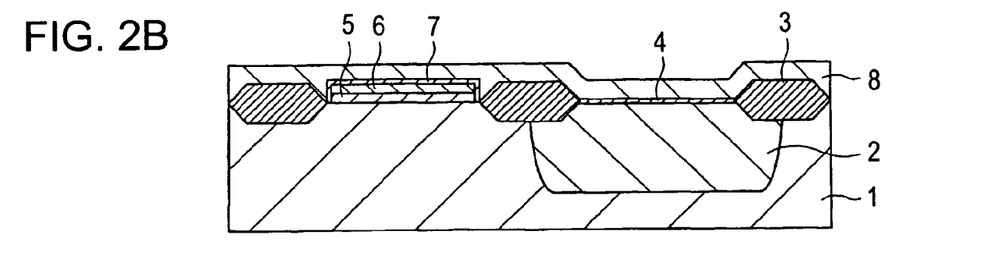
FIG. 2B is a cross-sectional view taken along the line IIB-IIB of FIG. 2A.
Figure 2C:
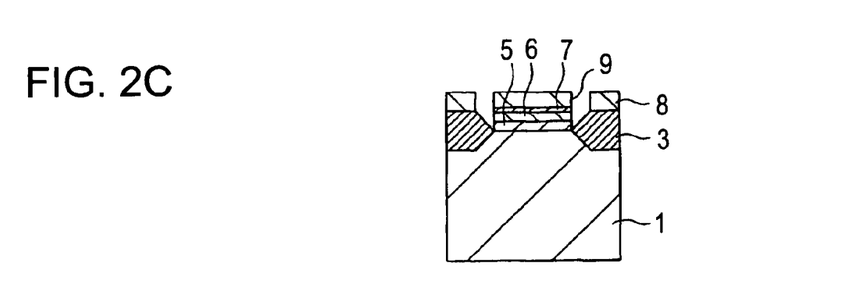
FIG. 2C is a cross-sectional view taken along the line IIC-IIC of FIG. 2A.

Next, as shown in FIGS. 2A to 2C, an anti-oxidation film 8 is formed in the SOI formation region R1 and the bulk region R2 so as to cover the second semiconductor layer 6, using a CVD method or the like. Here, a silicon nitride film may be used as the anti-oxidation film 8, for example. Further, by patterning the anti-oxidation film 8 and the sacrificing oxide film 7 using the photolithography and etching techniques, an opening 9, which exposes a part of an edge of the first semiconductor layer 5, is formed in the anti-oxidation film 8 and the sacrificing oxide film 7. Here, when the part of the edge of the first semiconductor layer 5 is exposed, a part of the rest of the edge of the first semiconductor layer 5 and the bulk region R2 are covered with the anti-oxidation film 8.

Figure 3A:
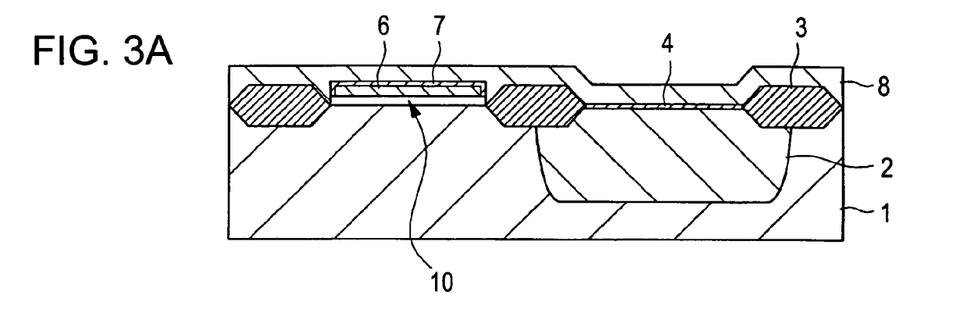
FIG. 3A is a cross-sectional view illustrating the method of manufacturing the semiconductor device according to the first embodiment of the invention.

Next, as shown in FIG. 3A, by bringing the first semiconductor layer 5 into contact with an etching gas or etching solution through the opening 9, the first semiconductor layer 5 is removed by the etching to form a cavity 10 between the semiconductor substrate 1 and the second semiconductor layer 6.

Here, it becomes possible to bring the first semiconductor layer 5, which is located below the second semiconductor layer 6, into contact with the etching gas or etching solution by forming the opening 9, which exposes the part of the edge of the first semiconductor layer 5, in the anti-oxidation film 8. Thereby, it is possible to form the cavity 10 between the semiconductor substrate 1 and the second semiconductor layer 6. In addition, since the part of the rest of the edge of the first semiconductor layer 5 is covered with the anti-oxidation film 8, even when the first semiconductor layer 5 is removed, it is possible to support the second semiconductor layer 6 on the semiconductor substrate 1 by means of the anti-oxidation film 8.

Further, when the semiconductor substrate 1 and the second semiconductor layer 6 are made of Si and the first semiconductor layer 5 is made of SiGe, it is desirable to use fluoronitric acid as an etching solution for the first semiconductor layer 5. Thereby, it is possible to obtain, the selectivity between Si and SiGe in a range of about 1:100 to 1:1000. Also, it is possible to remove the first semiconductor layer 5 while preventing the semiconductor substrate 1 and the second semiconductor layer 6 from being overetched.

Figure 3B:
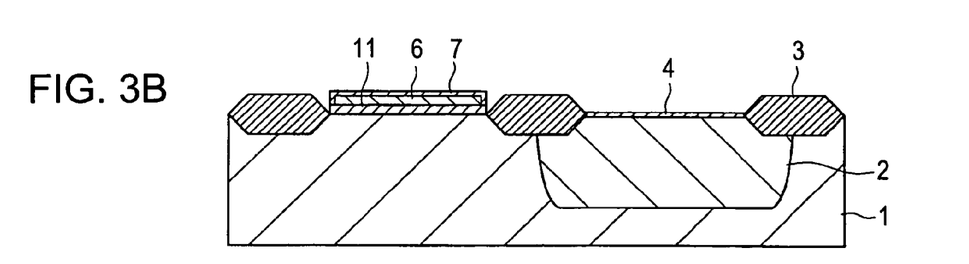
FIG. 3B is a cross-sectional view illustrating the method of manufacturing the semiconductor device according to the first embodiment of the invention.

Subsequently, as shown in FIG. 3B, by performing a thermal oxidation treatment on the semiconductor substrate 1 and the second semiconductor layer 6, an oxide film 11 is formed in the cavity 10 located between the semiconductor substrate 1 and the second semiconductor layer 6. In addition, after the oxide film 11 is formed, high-temperature annealing may be performed. Further, after the oxide film 11 is formed in the cavity 10 located between the semiconductor substrate 1 and the second semiconductor layer 6, the anti-oxidation film 8 is removed.

Figure 3C:
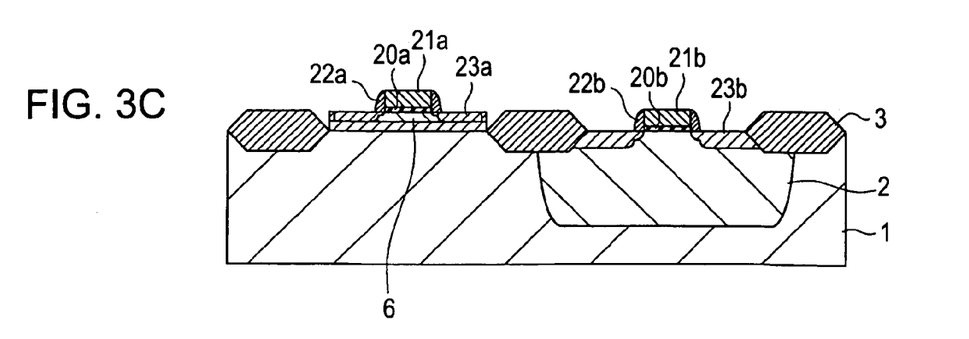
FIG. 3C is a cross-sectional view illustrating the method of manufacturing the semiconductor device according to the first embodiment of the invention.

Next, as shown in FIG. 3C, the pad oxide film 4 and the sacrificing oxide film 7 are removed to expose a surface of the semiconductor substrate 1 in the bulk region R2 and a surface of the second semiconductor layer 6. Further, the surfaces of the second semiconductor layer 6 and the semiconductor substrate 1 are heat-treated to form gate insulating films 20a and 20b thereon, respectively. Then, on the second semiconductor layer 6 and the semiconductor substrate 1 respectively having the gate insulating films 20a and 20b formed thereon is formed a polycrystalline silicon layer using the CVD method or the like. Then, the polycrystalline silicon layer is patterned by the photolithography and etching techniques to thereby form gate electrodes 21a and 21b on the second semiconductor layer 6 and the semiconductor substrate 1, respectively.

Next, by ion-implanting impurities, such as As, P, and B, into the second semiconductor layer 6 and the semiconductor substrate 1 with the gate electrodes 21a and 21b as masks, LDD layers, which are disposed at both sides of each of the gate electrodes 21a and 21b, respectively, and are composed of low-concentration impurity introduction layers, are formed on the second semiconductor layer 6 and the semiconductor substrate 1, respectively. Then, an insulating layer is formed on the second semiconductor layer 6 and the semiconductor substrate 1 having the LDD layer formed thereon, using the CVD method or the like, and then the insulating layer is etchbacked by anisotropic etching, such as RIE, thereby forming sidewalls 22a and 22b on side walls of the gate electrodes 21a and 21b, respectively. Then, by ion-implanting impurities, such as As, P, and B, into the second semiconductor layer 6 and the semiconductor substrate 1 with the gate electrodes 21a and 21b and the sidewalls 22a and 22b as masks, source/drain layers 23a and 23b, which are disposed on both the outer sides of the sidewalls 22a and 22b and are composed of high-concentration impurity introduction layers, are formed on the second semiconductor layer 6 and the semiconductor substrate 1, respectively.

Thereby, it is possible to form an SOI structure in the SOI formation region R1 and to form a bulk structure in the bulk region R2, without damaging the crystal quality of the second semiconductor layer 6. As such, the SOI structure and the bulk structure can be formed on the same semiconductor substrate 1 without using an SOI substrate. As a result, it is possible to form SOI transistors and transistors capable of withstanding high voltages on the same semiconductor substrate 1 while suppressing a cost increase.

For example, a logic circuit using total-depletion-mode SOI transistors may be formed in the SOI formation region R1, and an analog circuit capable of withstanding an intermediate voltage, which uses bulk transistors, may be formed in the bulk region R2.

Figure 4A:
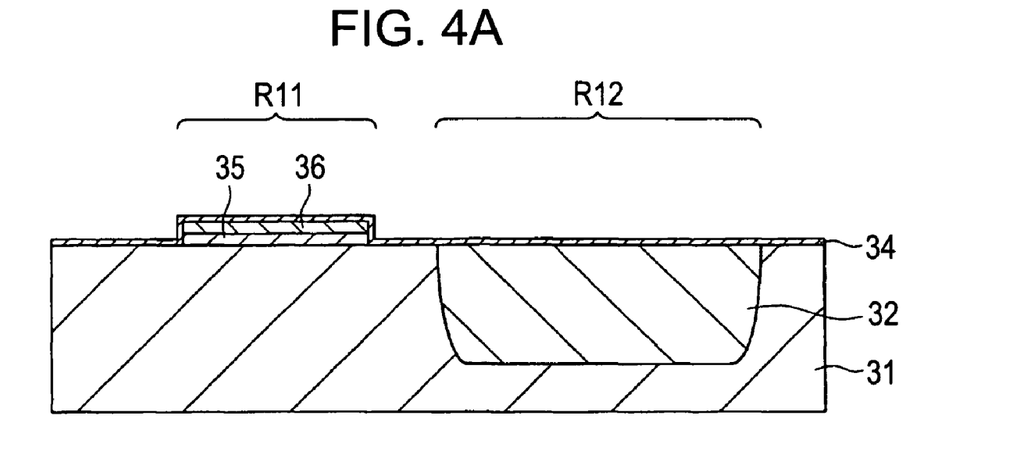
FIG. 4A is a cross-sectional view illustrating a method of manufacturing a semiconductor device according to a second embodiment of the invention.
Figure 4B:
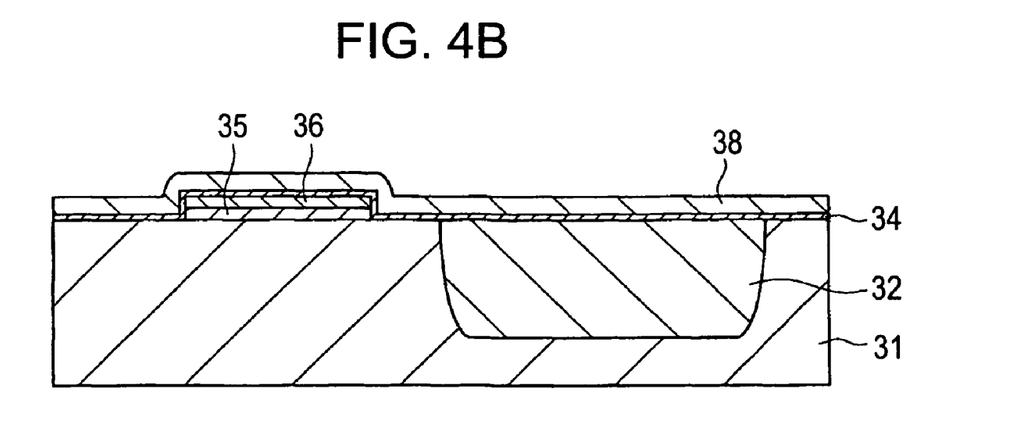
FIG. 4B is a cross-sectional view illustrating the method of manufacturing the semiconductor device according to the second embodiment of the invention.
Figure 5A:
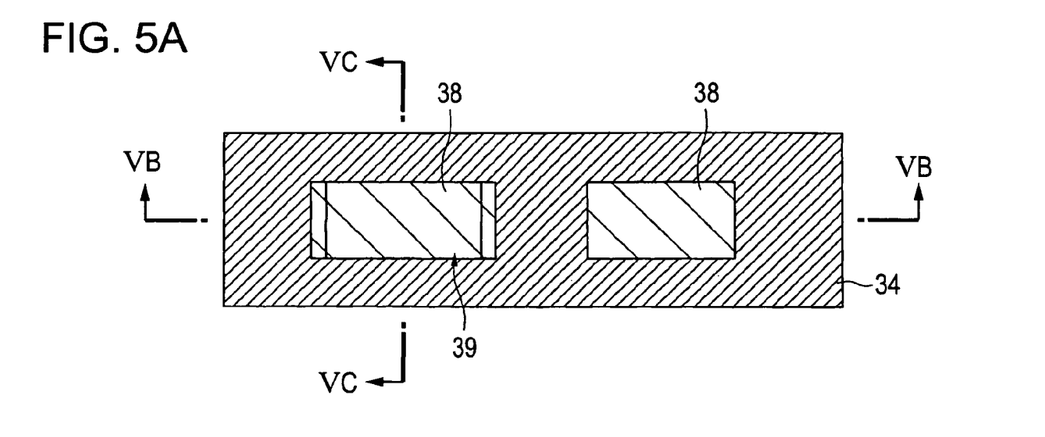
FIG. 5A is a plan view illustrating the method of manufacturing the semiconductor device according to the second embodiment of the invention.
Figure 5B:
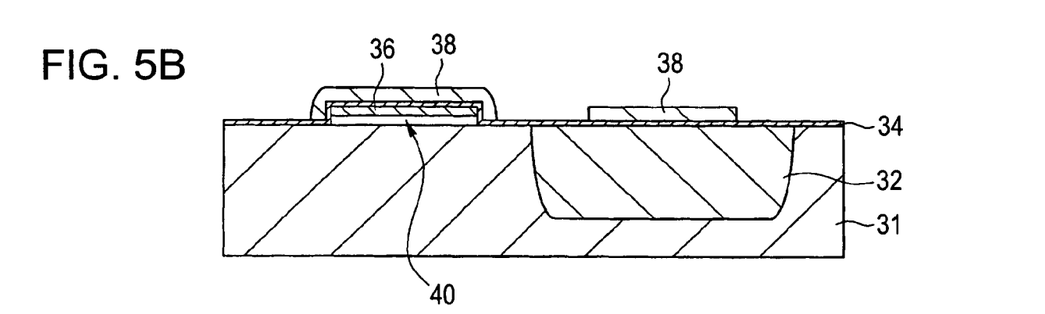
FIG. 5B is a cross-sectional view taken along the line VA-VA of FIG. 5A.
Figure 5C:
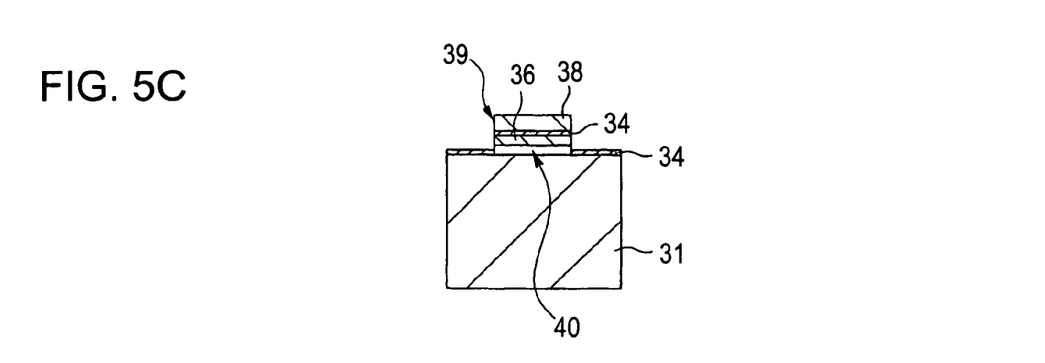
FIG. 5C is a cross-sectional view taken along the line VB-VB of FIG. 5A.
Figure 6A:
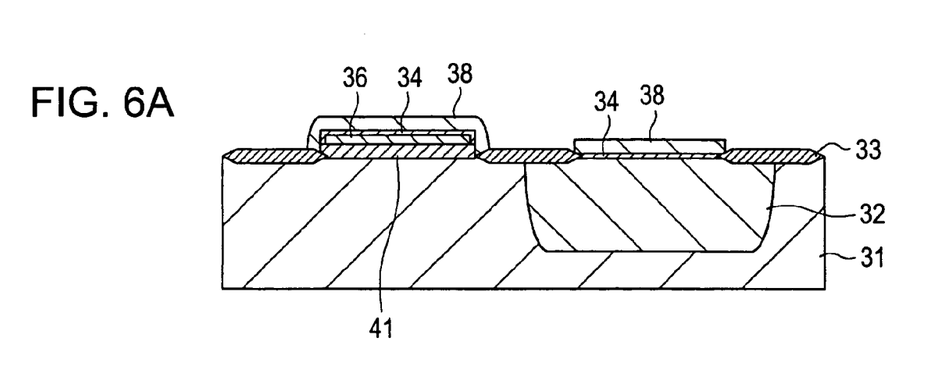
FIG. 6A is a cross-sectional view illustrating the method of manufacturing the semiconductor device according to the second embodiment of the invention.
Figure 6B:
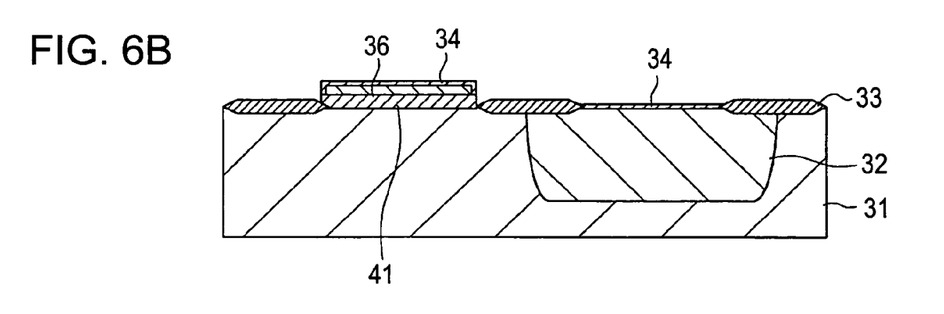
FIG. 6B is a cross-sectional view illustrating the method of manufacturing the semiconductor device according to the second embodiment of the invention.
Figure 6C:
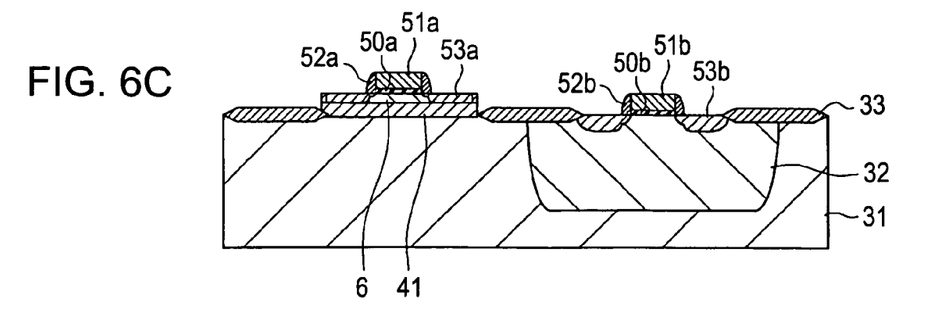
FIG. 6C is a cross-sectional view illustrating the method of manufacturing the semiconductor device according to the second embodiment of the invention.

FIGS. 4 and 6 are cross-sectional views illustrating a method of manufacturing a semiconductor device according to a second embodiment of the invention. FIG. 5A is a plan view illustrating the method of manufacturing the semiconductor device according to the second embodiment of the invention. FIG. 5B is a cross-sectional view taken along the line VB-VB of FIG. 5A. FIG. 5C is a cross-sectional view taken along the line VC-VC of FIG. 5A.

Referring to FIG. 4A, a semiconductor substrate 31 has an SOI formation region R11 and a bulk region R12. Further, impurities are ion-implanted into the bulk region R12 using photolithography and etching techniques, and then the semiconductor substrate 31 is heat-treated to form a well 32 in the bulk region R12. Then, a first semiconductor layer 35 and a second semiconductor layer 36 are sequentially formed in the SOI formation region R11 of the semiconductor substrate 31 by performing selective epitaxial growth. The first semiconductor layer 35 can be made of a material having a selectivity larger than those of the semiconductor substrate 31 and the second semiconductor layer 36 at the time of etching. Then, a sacrificing oxide film 34 is formed on surfaces of the second semiconductor layer 36 and the semiconductor substrate 31 by performing a thermal oxidation treatment on the second semiconductor layer 36 and the semiconductor substrate 31.

Next, as shown in FIG. 4B, an anti-oxidation film 38 is formed in the SOI formation region R11 and the bulk region R12 so as to cover the second semiconductor layer 36, using a CVD method or the like. Also, a silicon nitride film may be used as the anti-oxidation film 38, for example.

Subsequently, as shown in FIGS. 5A to 5C, by patterning the anti-oxidation film 38 using the photolithography and etching techniques, the anti-oxidation film 38 in an element separation region is removed, and an opening 39, which exposes a part of an edge of the first semiconductor layer 35, is formed in the anti-oxidation film 38 and the sacrificing oxide film 34. Here, when the part of the edge of the first semiconductor layer 35 is exposed, a part of the rest of the edge of the first semiconductor layer 35 and the bulk region R12 are covered with the anti-oxidation film 38. Further, by bringing the first semiconductor layer 35 into contact with an etching gas or etching solution through the opening 39, the first semiconductor layer 35 is removed by the etching to form a cavity 40 between the semiconductor substrate 31 and the second semiconductor layer 36.

Here, since it becomes possible to bring the first semiconductor layer 35, which is located below the second semiconductor layer 36, into contact with the etching gas or etching solution by forming the opening 39, which exposes the part of the edge of the first semiconductor layer 35, in the anti-oxidation film 38, the cavity 40 can be formed between the semiconductor substrate 31 and the second semiconductor layer 36. In addition, since the part of the rest of the edge of the first semiconductor layer 35 is covered with the anti-oxidation film 38, even when the first semiconductor layer 35 is removed, it is possible to support the second semiconductor layer 36 on the semiconductor substrate 31 by means of the anti-oxidation film 38.

Subsequently, as shown in FIG. 6A, by performing a thermal oxidation treatment on the semiconductor substrate 31 and the second semiconductor layer 36; an oxide film 41 is formed at the cavity 40 between the semiconductor substrate 31 and the second semiconductor layer 36, and an element separation film 33 is formed on the semiconductor substrate 31 to separate the SOI formation region R11 from the bulk region R12. In addition, after the oxide film 41 is formed, high-temperature annealing may be performed.

Next, as shown in FIG. 6B, by etching the anti-oxidation film 38, the anti-oxidation film 38 in the SOI formation region R11 and the anti-oxidation film 38 in the bulk region R12 are removed.

Next, as shown in FIG. 6C, the sacrificing oxide film 34 is removed to expose a surface of the semiconductor substrate 31 in the bulk region R12 and a surface of the second semiconductor layer 36. Further, the surfaces of the second semiconductor layer 36 and the semiconductor substrate 31 are heat-treated to form gate insulating films 50a and 50b thereon, respectively. Then, on the second semiconductor layer 36 and the semiconductor substrate 31 respectively having the gate insulating films 50a and 50b formed thereon is formed a polycrystalline silicon layer using the CVD method or the like. Then, the polycrystalline silicon layer is patterned by the photolithography and etching techniques to thereby form gate electrodes 51a and 51b on the second semiconductor layer 36 and the semiconductor substrate 31, respectively.

Next, by ion-implanting impurities, such as As, P, and B, into the second semiconductor layer 36 and the semiconductor substrate 31 with the gate electrodes 51a and 51b as masks, LDD layers, which are disposed at both sides of each of the gate electrodes 51a and 51b, respectively, and are composed of low-concentration impurity introduction layers, are formed on the second semiconductor layer 36 and the semiconductor substrate 31, respectively. Then, an insulating layer is formed on the second semiconductor layer 36 and the semiconductor substrate 31 having the LDD layer formed thereon, using the CVD method or the like, and then the insulating layer is etchbacked by anisotropic etching, such as RIE, thereby forming sidewalls 52a and 52b on side walls of the gate electrodes 51a and 51b, respectively. Then, by ion-implanting impurities, such as As, P, and B, into the second semiconductor layer 36 and the semiconductor substrate 31 with the gate electrodes 51a and 51b and the sidewalls 52a and 52b as masks, source/drain layers 53a and 53b, which are disposed on both the outer sides of the sidewalls 52a and 52b and are composed of high-concentration impurity introduction layers, are formed on the second semiconductor layer 36 and the semiconductor substrate 31, respectively.

Thereby, it is possible to form the SOI structure in the SOI formation region R11 and to form the bulk structure in the bulk region R12, while realizing the element separation of the semiconductor substrate 31. Therefore, the SOI structure and the bulk structure can be formed on the same semiconductor substrate 31 without using the SOI substrate, and accordingly, it is not necessary to perform an additional element separation process. As a result, it is possible to form SOI transistors and transistors capable of withstanding high voltages on the same semiconductor substrate 31 while suppressing a cost increase.

What is claimed is:

1. A method of manufacturing a semiconductor substrate, comprising:
   selectively forming a first semiconductor layer on a part of a surface of a base substrate;
   forming a second semiconductor layer on the first semiconductor layer, the second semiconductor layer having a selectivity smaller than that of the first semiconductor layer at the time of etching;
   forming an insulating film to cover the second semiconductor layer;
   forming an opening in the insulating film, the opening exposing a part of an edge of the first semiconductor layer;
   selectively etching the first semiconductor layer through the opening to form a cavity below the second semiconductor layer by removing the first semiconductor layer; and
   forming a buried oxide film in the cavity by performing a thermal oxidation treatment on the second semiconductor layer and the base substrate through the opening.

2. The method according to claim 1, further comprising:
   forming an element separation film before the forming of the first semiconductor layer,
   the forming of the first semiconductor layer being carried out such that the first semiconductor layer is separated by the element separation film.

3. The method according to claim 1,
   the forming of the opening being carried out after the forming of the insulating film.

4. A method of manufacturing a semiconductor device, comprising:
   forming a first semiconductor layer;
   forming a second semiconductor layer on the first semiconductor layer;
   forming an insulating film to cover the second semiconductor layer;
   forming an opening in the insulating film such that a part of the first semiconductor layer is exposed, the forming of the opening including removing a part of the insulating film;
   removing a part of the first semiconductor layer to form a cavity below the second semiconductor layer;
   forming a buried oxide film in the cavity;
   forming a gate electrode on the second semiconductor layer with the gate insulating film interposed therebetween; and
   forming a source or a drain on the second semiconductor layer so as to be disposed at both sides of the gate electrode, respectively.

5. The method according to claim 4, further comprising:
   forming an element separation film before the forming of the first semiconductor layer,
   the forming of the first semiconductor layer being carried out such that the first semiconductor layer is separated by the element separation film.

6. The method according to claim 4,
   the forming of the opening is carried out after the forming of the insulating film.

7. A method of manufacturing a semiconductor substrate, comprising:
   forming a first semiconductor layer;
   forming a second semiconductor layer on the first semiconductor layer;
   forming an insulating film to cover the second semiconductor layer;
   forming an opening in the insulating film such that a part of the first semiconductor layer is exposed, the forming of the opening including removing a part of the insulating film;
   forming a cavity below the second semiconductor layer, the forming of the cavity including removing a part of the first semiconductor layer; and
   forming a buried oxide film in the cavity.

8. The method according to claim 7,
   the forming of the buried oxide film including a thermal oxidation treatment of the second semiconductor layer and the semiconductor substrate through the opening.

9. The method according to claim 7,
   the removing of the part of the first semiconductor layer being carried out by an etching process.

10. The method according to claim 9,
    the first semiconductor layer being etched more easily during a period in which the etching process is carried out than the second semiconductor layer.

* * * * *